(12) United States Patent
Natori

(10) Patent No.: US 6,443,597 B1
(45) Date of Patent: Sep. 3, 2002

(54) PLANE DISPLAY UNIT AND PLANE DISPLAY DEVICE

(75) Inventor: Takehisa Natori, Kanagawa (JP)

(73) Assignee: Sony Corporation, Tokyo (JP)

( * ) Notice: Subject to any disclaimer, the term of this patent is extended or adjusted under 35 U.S.C. 154(b) by 42 days.

(21) Appl. No.: 09/650,808

(22) Filed: Aug. 30, 2000

(30) Foreign Application Priority Data

Sep. 1, 1999 (JP) .......................................... P11-247619

(51) Int. Cl.$^7$ ............................................. F21Y 101/02
(52) U.S. Cl. ...................... 362/304; 362/800; 362/302; 362/307; 362/252
(58) Field of Search ............................... 362/800, 311, 362/300, 302, 304, 307, 249, 252

(56) References Cited

U.S. PATENT DOCUMENTS

| | | | | |
|---|---|---|---|---|
| 4,152,618 A | * | 5/1979 | Abe et al. ............... | 362/800 X |
| 5,008,788 A | * | 4/1991 | Palinkas ................. | 362/800 X |
| 5,226,723 A | * | 7/1993 | Chen ...................... | 362/800 X |
| 6,170,963 B1 | * | 1/2001 | Arnold .................... | 362/800 X |

* cited by examiner

Primary Examiner—Laura K. Tso
(74) Attorney, Agent, or Firm—Jay H. Maioli

(57) ABSTRACT

A plane display unit using LEDs without letting the colors of the individual pixels appear separately or without letting the pixels appear as a set of visible dots even when the screen displaying an image or a character is viewed in close range, and a plane display device using the same. Pixels having light-emitting surfaces of a square shape that is inclined by 45° are arranged on a substrate in a direction inclined toward the right and in a direction inclined toward the left with the sides of the light-emitting surfaces being opposed to each other. The shape and size of the surface of the substrate are selected to be the same as the shape and size of the contours of the light-emitting surfaces of all pixels on the substrate. The pixels are formed by covering plural LEDs of different colors with a transparent material in which a light-scattering material is contained.

11 Claims, 7 Drawing Sheets

Position of LED Pellet

PLANE DISPLAY UNIT AND PLANE DISPLAY DEVICE

BACKGROUND OF THE INVENTION

1. Field of the Invention

The present invention relates to a plane display unit in which pixels using light-emitting elements are arranged in a plural number on a substrate, and to a plane display apparatus using the plane display unit.

2. Description of the Related Art

A plane display unit having a plurality of pixels of LEDs (light-emitting diodes) arranged on a substrate has been widely used by itself as a display unit for constituting a screen or as a display unit for constituting a large screen by being arranged in a plural number like tiles.

Among the conventional LED plane display units, the one which displays the image upon inputting video signals is so constructed, as shown in FIG. 7, that a pixel is formed by a total of three light-emitting portions (in the drawing, these light-emitting portions are denoted by R, G and B), i.e., a light-emitting portion having a red LED pellet (LED chip), a light-emitting portion having a green LED pellet and a light-emitting portion having a blue LED pellet, and a plurality of the pixels are arranged in the transverse direction and in the longitudinal direction.

Further, among the LED plane display units, the one which displays various guide data in the form of characters is so constructed, as shown in FIG. 8, that LED pellets 21 and 22 of two different colors (e.g., yellowish green color and red color) are mounted on a substrate 23 being brought close to each other, the circumference of these LED pellets 21 and 22 is surrounded by a reflector frame 24, the upper portion thereof is covered with a disk-like transparent scattering plate 25 to form a pixel 26 having a circular light-emitting surface as shown in FIG. 9, and a plurality of these pixels 26 are arranged in the transverse direction and in the longitudinal direction as shown.

In the LED plane display unit for displaying image shown in FIG. 7, however, each light-emitting portion emits light of only one color. Unless a person views the screen from a certain amount of distance, therefore, the colors of the individual light-emitting portions appear separately, which is a deterioration in the picture quality.

In the future, however, it is considered that the LED plane display unit for displaying image might be installed not only on a place at where it is viewed from a distance, such as on the wall of a building outdoors but also on a place at where it is viewed from a close range and, hence, that the above inconvenience may become conspicuous.

This inconvenience can be solved by, for example, narrowing the gap among the light-emitting portions in a pixel as shown in FIG. 10. When the gap among the light-emitting portions is narrowed in each pixel under a fixed pixel pitch condition, however, the gap increases among the pixels as shown. When the screen is viewed from a close range, therefore, the individual pixels can be clearly discerned and the picture may appear as a set of so-called lumpy dots, which is a deterioration in the picture quality, too.

With the element of the LED plane display unit for displaying characters as shown in FIGS. 8 and 9, on the other hand, light from the LED pellet 21 and light from the LED pellet 22 are scattered through the scattering plate 25. Therefore, the light-emitting surface emits light of a color which is a mixture of yellowish green color and red color. Even when the screen is viewed from a close range, therefore, yellowish green color and red color do not appear separately. However, since the light-emitting surface is of a circular shape, the areas among the light-emitting surfaces are never small compared to the areas of the light-emitting surfaces as shown in FIG. 9. When the screen is viewed from a close range, therefore, the individual pixels 26 are clearly discerned and the character appears as a set of lumpy dots, which, still, is a deterioration in the picture quality.

The LED plane display elements for displaying characters have now been installed in many places at where it can be seen from a close range, such as in the trains, letting the above-mentioned inconvenience to appear conspicuously.

SUMMARY OF THE INVENTION

It is an object of the present invention to provide a plane display unit which improves the separate and distinguished appearance of the pixels that use light-emitting elements such as LEDs and improves the appearance of a set of visible dots even when the screen displaying pictures and characters is viewed from a close range, as well as to provide a plane display apparatus using the above plane display unit.

The plane display unit of this invention and the plane display apparatus in which the above units are arranged in plural numbers like a matrix of this invention, are characterized in that the pixels having light-emitting surfaces of nearly a rhombic shape are arranged on a substrate in a direction inclined toward the right and in a direction inclined toward the left with the sides of the light-emitting surfaces being opposed to each other.

The rhombic shape, in general, stands for a quadrilateral of which the sides all have an equal length, and the angle subtended by the neighboring sides is not 90°. In this specification, however, "nearly rhombic shape" encompasses not only the rhombic shape but also those close to the rhombic shape, such as a quadrilateral (i.e., a square that is inclined by 45°) of which the sides all have an equal length and the angle subtended by the neighboring sides is 90°.

In this plane display unit, plural pixels having a light-emitting surface of nearly a rhombic shape are arranged on the substrate in a direction inclined toward the right and in a direction inclined toward the left with the sides of the light-emitting surfaces being opposed to each other or, in other words, are so arranged that the gaps among the light-emitting surfaces form an inclined lattice shape.

Due to the shape and arrangement of the light-emitting surfaces, the plane display unit has a small ratio of the areas among the light-emitting surfaces to the areas of the light-emitting surfaces. Even when viewed from a close range, therefor, the individual pixels do not appear distinctly as compared to the conventional plane display unit shown in FIG. 9. When viewed in a close range, therefore, the image and characters do not appear as a set of visible pixels.

In the plane display unit, further, the pixel pitch in the transverse direction of the screen is not the pixel pitch among the pixels neighboring in the transverse direction but is the transverse direction component of the pixel pitch among the pixels neighboring in a inclined direction. Therefore, the pixel pitch becomes shorter than the pixel pitch in the transverse direction of the plane display unit in which the pixels having circular or square light-emitting surfaces are arranged in the transverse direction and in the longitudinal direction. Similarly, the pixel pitch in the longitudinal direction on the screen is not apparently the pixel pitch among the pixels neighboring in the longitudinal direction but is the longitudinal direction component of the pixel pitch among the pixels neighboring in the inclined direction. Therefore, the pixel pitch becomes shorter than the pixel pitch in the longitudinal direction of the plane display unit on which the pixels having circular or square light-emitting surfaces are arranged in the transverse direction and in the longitudinal direction.

As described above, the pixel pitch which is apparently small in the transverse direction and in the longitudinal direction on the screen, contributes to enhancing the transverse resolution and the longitudinal resolution.

In the plane display unit, it is desired that the surface of the substrate has a shape nearly the same as the contours of the light-emitting surfaces of all pixels on the substrate or, in other words, has a saw-tooth shape to meet the contours of the light-emitting surfaces instead of the square shape and that the distance from the light-emitting surface located closest to the edge of the substrate surface to the edge of the substrate surface, is not larger than about one-half the distance between the light-emitting surfaces having sides opposed to each other on the substrate.

In arranging the plane display units in a plural number like a tile to constitute a large screen, therefore, the gap between the light-emitting surfaces at the boundary of the neighboring plane display units can be set to be equal to the gap among the light-emitting surfaces on the substrate of the plane display unit, making it possible to maintain uniformity in the pixel pitch even at the boundaries.

As another example, further, the surface of the substrate in the plane display unit may have a size smaller than the size of contours of the light-emitting surfaces of all pixels on the substrate. In this case, too, the gap among the light-emitting surfaces at the boundaries of the neighboring plane display units can be set to be nearly equal to the gap among the light-emitting surfaces on the substrate of the plane display unit at the time of constituting a large screen by arranging plural plane display units like a tile, making it possible to maintain a uniform pixel pitch even at the boundaries.

In the plane display unit, it is desired that the number of the pixels on the substrate in the transverse direction is equal to the number of the pixels on the substrate in the longitudinal direction.

When the plane display units are arranged in the transverse direction and in the longitudinal direction in numbers of 4n and 3n (n is an integer), then, there is constituted a screen having an aspect ratio of 4:3. When the plane display units are arranged in the transverse direction and in the longitudinal direction in numbers of 16n and 9n, then, there is constituted a screen having an aspect ratio of 16:9. Thus, the screen having a desired aspect ratio can be easily constituted.

In the plane display unit, when LEDs are used as light-emitting elements, it is desired to form the pixels by covering the LEDs mounted on the substrate with a transparent material that contains a material that scatters light. Upon covering the LEDs with the transparent material containing the scattering material, light from the LEDs are homogeneously scattered over the whole light-emitting surfaces, and the brightness becomes uniform on the light-emitting surfaces.

In the plane display unit, further, it is desired to use a material having a refractive index different from that of the transparent material, as the scattering material. Upon refracting light from the LED by using the scattering material as described above, a decreased amount of light travels in the directions other than the light-emitting surfaces among the light arriving at the scattering material from the LEDs and, hence, the light-emitting efficiency is improved. Among the light incident on the scattering material from the external side, further, less light returns back to the external side, preventing a drop in the contrast caused by light incident from the external side.

In the plane display unit, it is desired to use the material having a refractive index smaller than that of the transparent material, as the scattering material. In selecting the material used as the scattering material and the material used as the transparent material, the material having a relatively large refractive index can be used as the transparent material. This makes it possible to decrease the difference in the refractive index between the LED (usually, having a refractive index of as high as 4 to 5) and the transparent material and, hence, to decrease the ratio of total reflection of light from the LEDs reflected by the boundary surface between the LEDs and the transparent material and, accordingly, to suppress a drop in the light emitting efficiency caused by the total reflection.

In the plane display unit, further, it is desired to surround the light-emitting diodes with a material that reflects light and to bury space surrounded by the reflecting material in the transparent material. Then, even light that has traveled in the directions other than the light-emitting surfaces among light that has arrived at the scattering material from the LEDs, is caused to travel again in the direction of the light-emitting surfaces by being reflected by the reflecting material, contributing to further enhancing the light-emitting efficiency.

In the plane display unit, further, it is desired to form the pixels by covering plural light-emitting diodes of different colors with the above-mentioned transparent material. Upon covering the plurality of LEDs of different colors with the transparent material, light from the individual LEDs is scattered through the scattering material, and the light-emitting surfaces emit light of a color of a mixture of the above colors. Even when the screen is viewed in a close range, therefore, the colors do not appear separately.

BRIEF DESCRIPTION OF THE DRAWINGS

These and other objects and features of the present invention will become clear from the following description of the preferred embodiments given with reference to the accompanying drawings, in which.

DESCRIPTION OF THE PREFERRED EMBODIMENTS

The following description deals with an embodiment of when the present invention is applied to an LED plane display unit.

Figure 1:
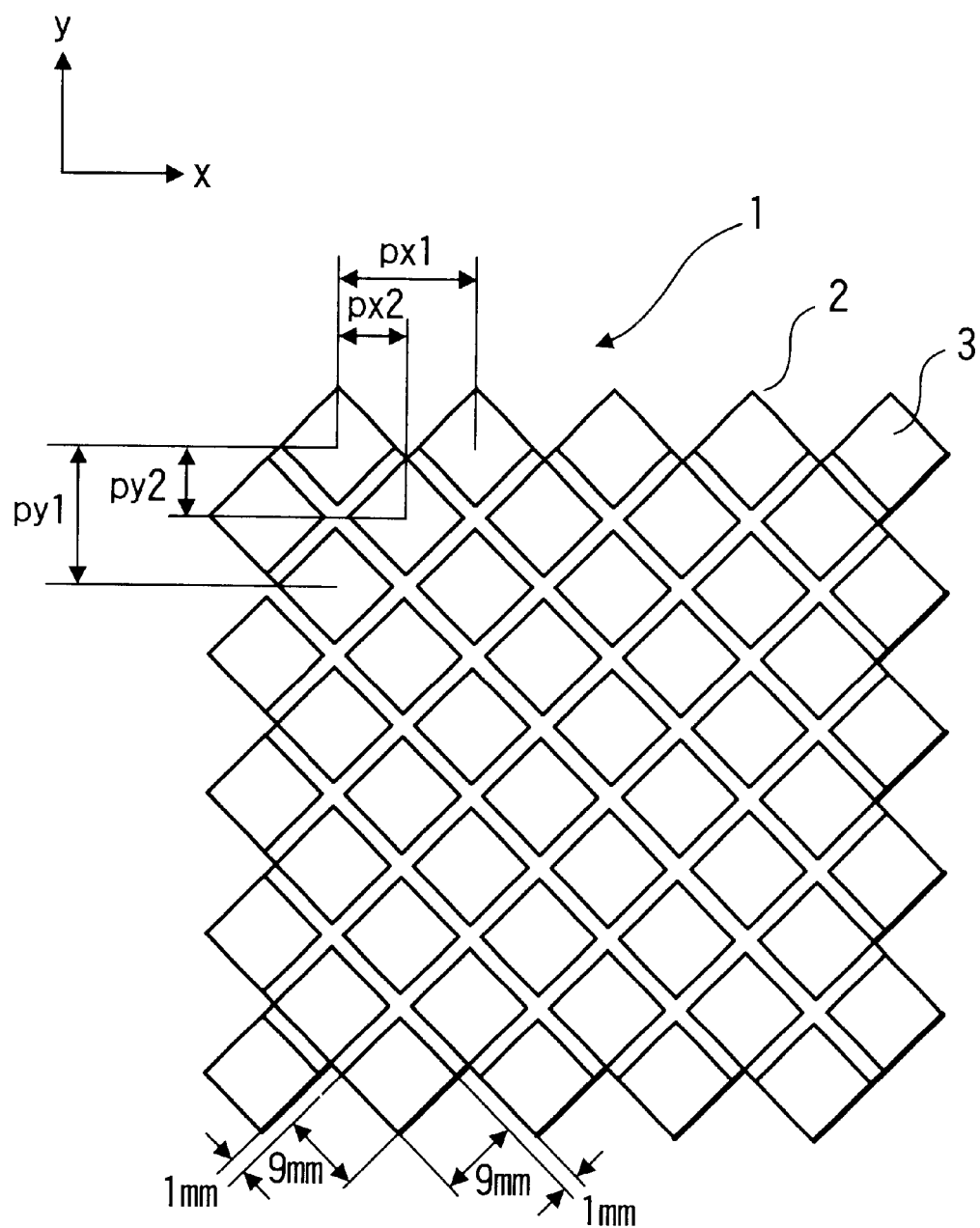
FIG. 1 is a plan view illustrating the appearance of an LED plane display unit to which the present invention is applied.

FIG. 1 is a diagram illustrating the appearance of the LED plane display unit to which the present invention is applied as viewed from the side of the display surface. In the LED plane display unit 1, there are arranged, on a substrate 2, a plurality of pixels 3 having light-emitting surfaces of a square shape that is inclined by 45°, i.e., with their diagonal lines being oriented in the transverse direction (x-direction in the drawing) and in the longitudinal direction (y-direction in the drawing) on the surface of the substrate 2, with the sides of the light-emitting surfaces being opposed to each other in the direction inclined toward the right and in the direction inclined toward the left on the surface of the substrate or, in other words, such that the gaps among the light-emitting surfaces will form an inclined lattice shape.

The side of the light-emitting surface of each pixel 3 has a length of about 9 mm. The gap between the sides of the light-emitting surfaces of the pixels 3 neighboring in the inclined direction is about 1 mm.

The number of the pixels 3 on the surface of the substrate 2 in the transverse direction is equal to the number of the pixels on the surface of the substrate in the longitudinal direction (five in each direction in the drawing).

The shape of the surface of the substrate 2 is the same as the shape of the contours of the light-emitting surfaces of all pixels 3 on the substrate 2 (or, in other words, has a saw-tooth shape to meet the contours of the light-emitting surfaces). Further, the size of the surface of the substrate is the same as the size of the contours of the light-emitting surfaces (or, in other words, the distance is zero from the light-emitting surface located closest to the edge of the surface of the substrate to the edge of the surface of the substrate).

Figure 9:
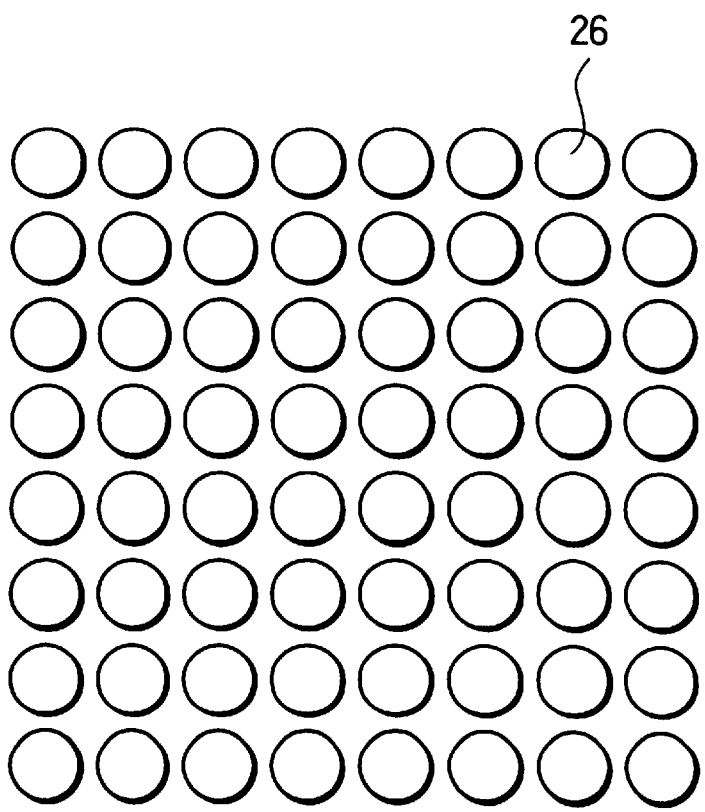
FIG. 9 is a view illustrating the shape and arrangement of the light-emitting surfaces of pixels in the conventional LED plane display element for displaying characters.
Figure 10:
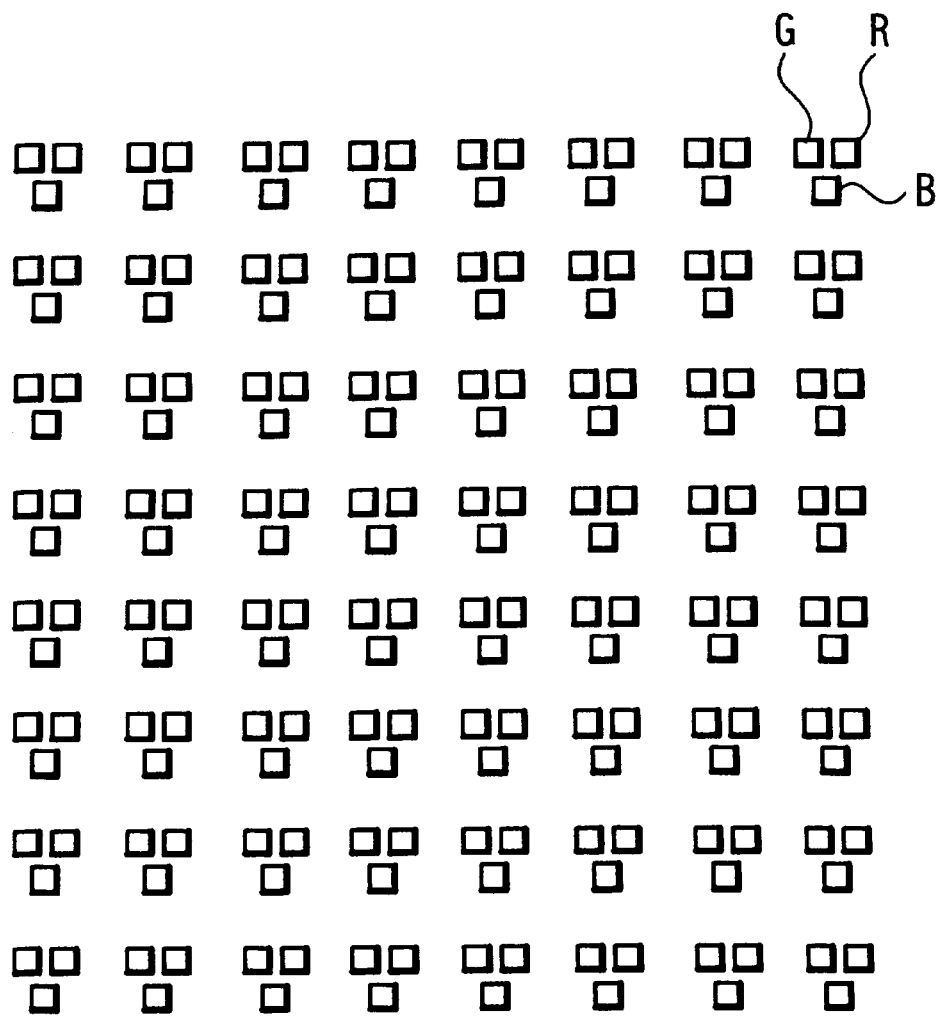
FIG. 10 is a plan view illustrating the shape and arrangement of the light-emitting surfaces of pixels in the conventional LED plane display element for displaying image.

Owing to the above-mentioned shape and arrangement of the light-emitting surfaces on the LED plane display unit 1, the ratio of the areas of the gaps among the light-emitting surfaces to the areas of the light-emitting surfaces becomes small. Even when the screen is viewed in a close range, therefore, the individual pixels do not clearly appear as those of the conventional plane display unit shown in FIG. 9. Even when the screen is viewed in a close range, therefore, the image and character do not appear as a set of visible pixels.

In the LED plane display unit 1, further, the pixel pitch on the screen in the transverse direction is not apparently the pixel pitch (px 1 in FIG. 1) between the pixels 3 neighboring in the transverse direction but is a transverse direction component (px 2 in FIG. 1) of the pixel pitch between the pixels 3 neighboring in the inclined direction. The vale px 2 is given by the following formula 1, $$px\,2 = 9\sqrt{2}/2 + \sqrt{2}/2 = 10/\sqrt{2}\ mm \qquad \text{[Numerical 1]}$$

Similarly, the pixel pitch on the screen in the longitudinal direction is not the pixel pitch (py 1 in FIG. 1) between the pixels 3 neighboring in the longitudinal direction but is a longitudinal direction component (py 2 in FIG. 1) of the pixel pitch between the pixels 3 neighboring in the inclined direction. The vale py 2 is the same as the value px 2.

Figure 2:
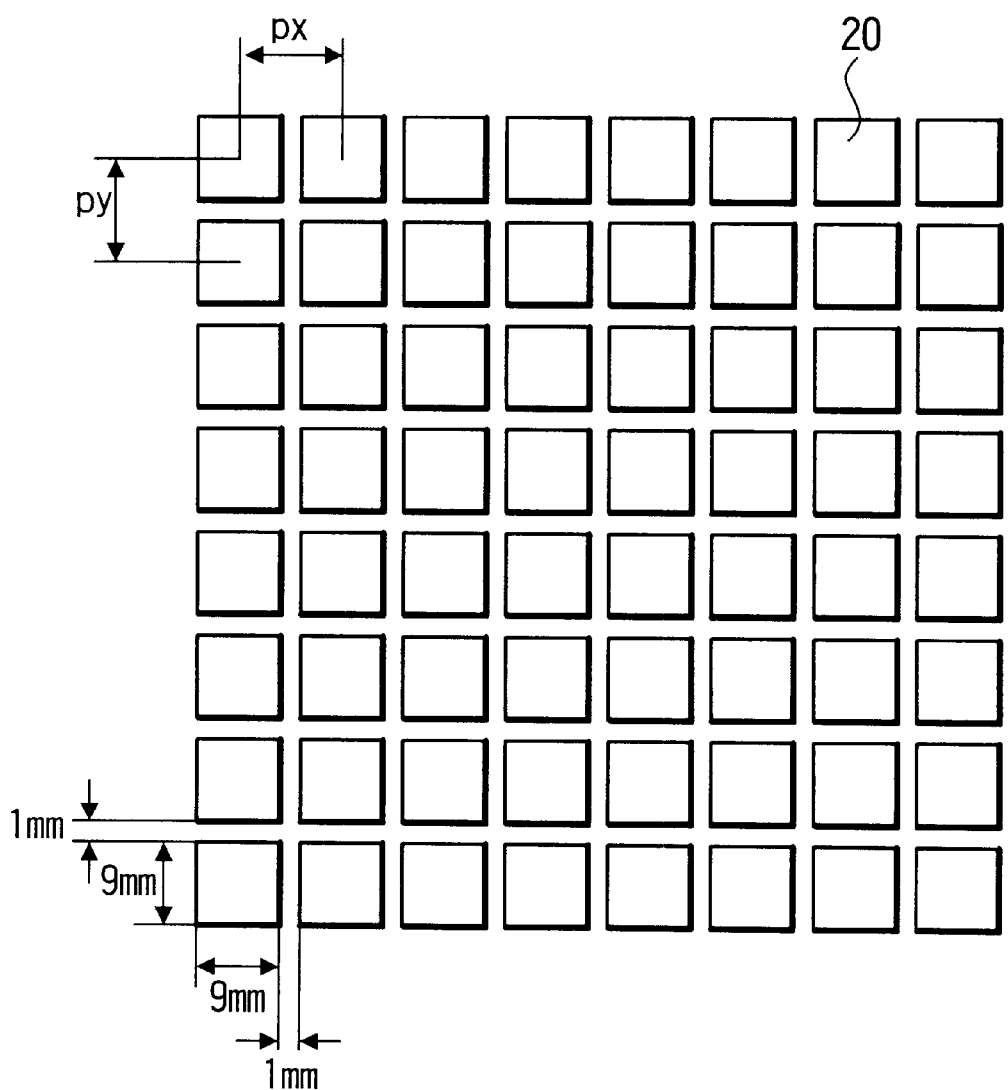
FIG. 2 is a plan view illustrating a pixel pitch of the plane display unit on which the pixels having a square light-emitting surface are arranged in the transverse direction and in the longitudinal direction.

Referring to FIG. 2, on the other hand, when plural pixels 20 having square light-emitting surfaces with a side of 9 mm same as that of the light-emitting surfaces of the pixels 3, are arranged in the transverse direction and in the longitudinal direction maintaining a gap of 1 mm among the light-emitting surfaces, the value of the pixel pitch px in the transverse direction becomes as given by the following formula 2, and the value of the pixel pitch py in the longitudinal direction becomes the same as the value px, $$px = 9/2 + 1 + 9/2 = 10\ mm \qquad \text{[Numerical 2]}$$

Therefore, the pixel pitches px2, py2 of the LED plane display unit 1 are $\sqrt{1/\sqrt{2}}$ of the pixel pitches px, py of the plane display unit on which the pixels having light-emitting surfaces of a square shape shown in FIG. 2 are arranged in the transverse direction and in the longitudinal direction.

As described above, a decrease in the apparent pixel pitch on the screen in the transverse direction and in the longitudinal direction, helps increase the horizontal resolution and the vertical resolution on the LED plane display unit 1.

Figure 3:
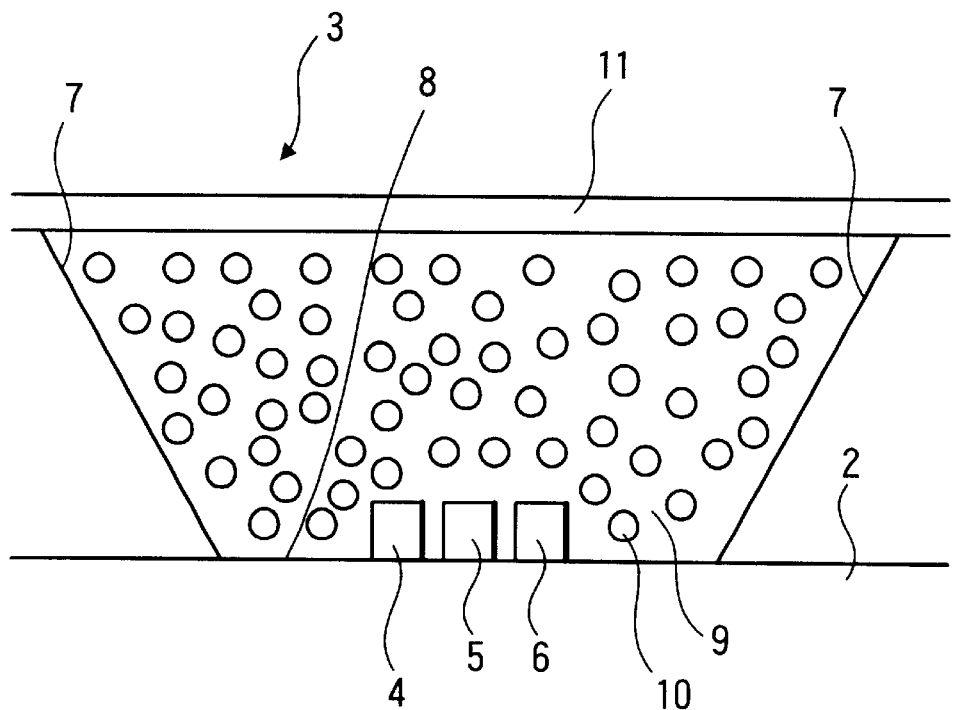
FIG. 3 is a sectional view illustrating the structure of an element on the LED plane display unit of FIG. 1.

Next, FIG. 3 is a sectional view showing the structure of the pixel 3 of the LED plane display unit 1 as viewed from the side surface of the LED plane display unit 1. LED pellets 4, 5 and 6 of red, green and blue colors are mounted on the substrate 2 being close to each other. The LED pellets 4, 5 and 6 are surrounded by a reflector frame 7 that reflects light. A reflector surface (mirror surface) 8 is formed even on the surface of the substrate 2 of a portion surrounded by the reflector frame 7.

Figure 4:
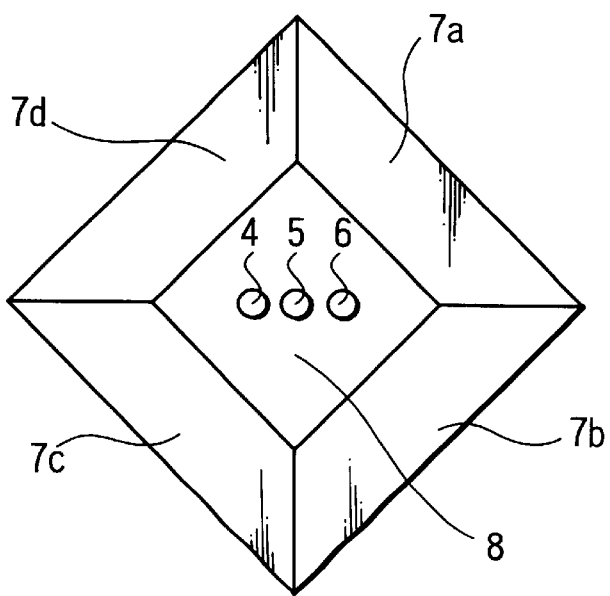
FIG. 4 is a plan view of when a reflection frame of FIG. 3 is viewed from the display surface of the element on the LED plane display unit.

FIG. 4 is a view of when the reflector frame 7 is seen from the display surface side of the pixel 3 on the LED plane display unit 1. The surface of the reflector frame 7 includes four pieces of trapezoidal reflector surfaces (mirror surfaces) 7a, 7b, 7c and 7d. These mirror surfaces 7a to 7d are so positioned that the shorter bottom sides thereof form a square shape that is inclined by 45° on the surface of the substrate 2, and have longer bottom sides of about 9 mm.

Referring to FIG. 3, space surrounded by the reflector frame 7 is filled and molded with a transparent thermosetting resin 9 having a relatively large refractive index (e.g., a refractive index of about 1.5) in a manner of being blended with fine particles 10 of a resin or a glass having a refractive index smaller than that of the resin 9 without voids (in the drawing, particles 10 are drawn on an exaggerated scale for convenience). The surface of the resin 9 forms a light-emitting surface of a square shape that is inclined by 45° as shown in FIG. 1. The surface of the resin 9 of the pixel 3 is covered with a common protection sheet 11 of a transparent resin having the same refractive index as that of the resin 9.

The pixel 3 having the above structure uses a substance having a refractive index different from that of the transparent resin 9 as the particles 10. Therefore, light emitted from the LED pellets 4, 5 and 6 is refracted by numerous particles 10 in the resin 9, and is homogeneously scattered over the whole light-emitting surfaces. Accordingly, the light-emitting surfaces emit light of a color which is a mixture of red, green and blue, and the brightness becomes uniform on the light-emitting surfaces.

The pixel 3 has a high light-emitting efficiency on account of the following reasons (1) to (3).

(1) In selecting fine particles 10 which are used as the scattering material and the resin 9 which is used as the transparent material, a material having a relatively high refractive index may be selected as the resin 9. This makes it possible to decrease the difference in the refractive index between the LED pellets 4, 5, 6 which usually have a refractive index of as high as 4 to 5 and the resin 9, and, hence, to decrease the ratio of total reflection of light from the LED pellets 4, 5, 6 on the boundary surfaces between the LED pellet 4, 5, 6 and the resin 9 making it possible to suppress a drop in the light-emitting efficiency caused by the total reflection.

(2) Light from the LED pellets 4, 5 and 6 is refracted by the particles 10 so as to be scattered. Therefore, very small amount of light travels in the directions other than the light-emitting surfaces among light arriving at the particles 10 from the LED pellets 4, 5, 6, as compared to when light-reflecting particles are mixed into the resin 9 and light from the LED pellets 4, 5, 6 is reflected by the particles and is scattered.

(3) Even light that has travelled in the directions other than the light-emitting surfaces among light that has arrived at the particles 10 from the LED pellets 4, 5, 6, can be reflected by the mirror surfaces 7a to 7d of the reflector frame 7 and by the mirror surface 8 to travel again in the direction of the light-emitting surfaces.

In the pixel 3, further, very small amount of light returns back to the external side among light that has fallen on the particles 10 from the external side as compared to when light-reflecting particles are mixed into the resin 9. Therefore, this also prevents a drop in the contrast caused by light incident from the external side.

Figure 5:
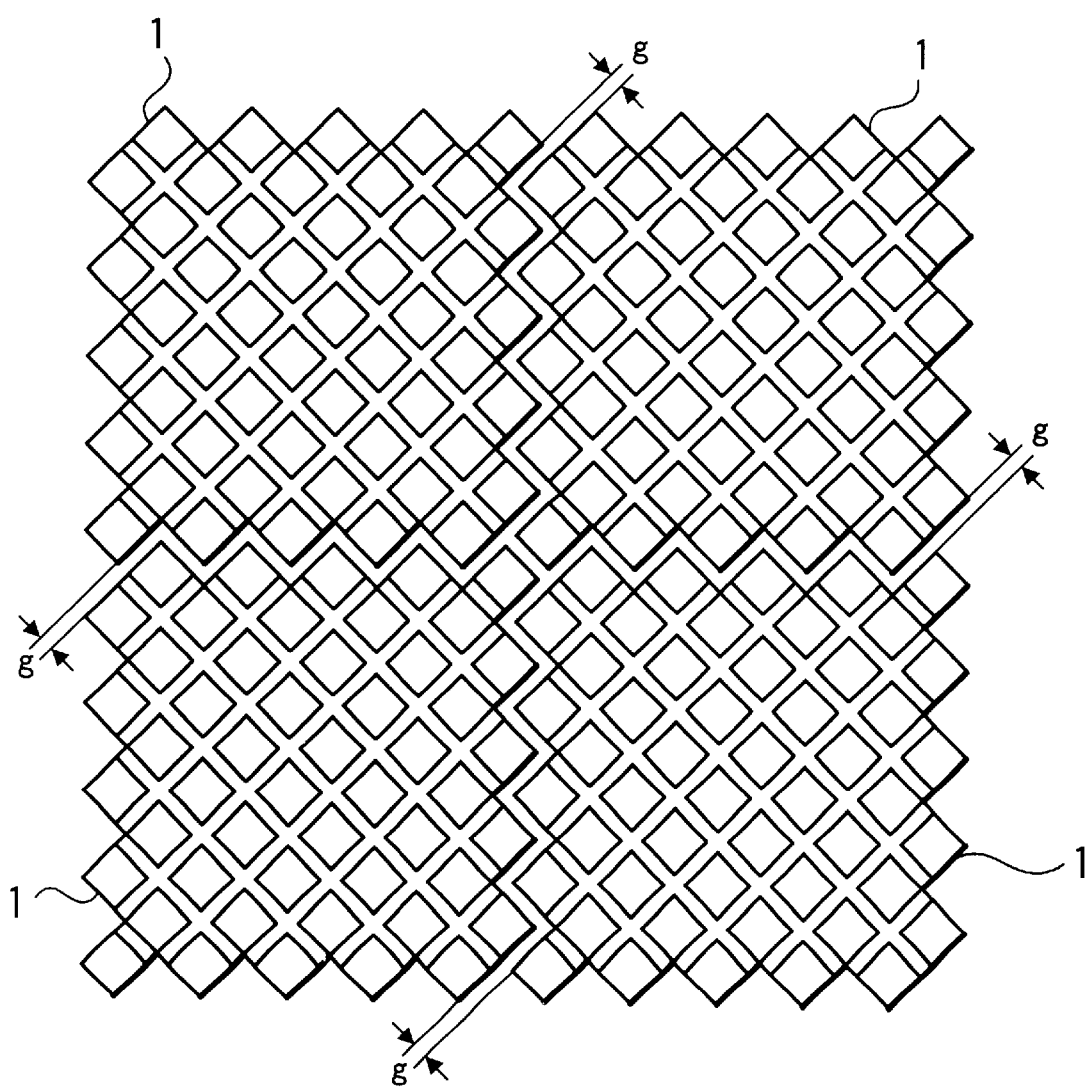
FIG. 5 is a plan view of when the LED plane display units of FIG. 1 are arranged in a plural number like tiles to constitute a large screen.

Next, FIG. 5 shows a state where the LED plane display units 1 are arranged in a plural number like tiles (in the longitudinal and transverse directions like a matrix). The shape and size of the surface of the substrate 2 of the LED plane display unit 1 are the same as the shape and size of the contours of the light-emitting surfaces of all pixels 3 on the substrate 2. In realizing a plane display apparatus that constitutes a large screen by arranging the plural display units like tiles as shown in FIG. 5, therefore, the gap (g in FIG. 5) among the light-emitting surfaces at the boundaries of the neighboring LED plane display units 1 can be set to be about 1 mm which is the gap among the light-emitting surfaces on the substrate 2 of the LED plane display unit 1. It is therefore allowed to maintain uniformity of the pixel pitch even at the boundaries.

Further, the number of the pixels 3 in the transverse direction on the surface of the substrate of the LED plane display unit 1 is equal to the number of the pixels 3 on the surface of the substrate in the longitudinal direction. Upon arranging the LED plane display units in numbers of 4n and 3n (n is an integer) in the transverse direction and in the longitudinal direction, therefore, it is allowed to constitute a screen having an aspect ratio of 4:3. Upon arranging the LED plane display units in numbers of 16n and 9n in the transverse direction and in the longitudinal direction, further, it is allowed to constitute a screen having an aspect ratio of 16:9. Thus, the screen having any desired aspect ratio can be easily constituted.

In the foregoing embodiment, not only the shape of the surface of the substrate 2 of the LED plane display unit 1 is selected to be the same as the shape of the contours of the light-emitting surfaces of all pixels 3 on the substrate 2, but also the size of the surface of the substrate is selected to be the same as the size of the contours. However, the size of the surface of the substrate may be selected to be larger than the contours within a range in which the distance from the light-emitting surface located closest to the edge of the surface of the substrate to the edge of the substrate does not exceed 0.5 mm (i.e., one-half of 1 mm which is the gap among the light-emitting surfaces of which the sides are opposing to each other on the substrate 2). In this case, too, the gap among the light-emitting surfaces can be set to be about 1 mm at the boundaries of the neighboring LED plane display units at the time of constituting a large srceen by arranging plural LED plane display units like tiles, making it possible to maintain uniform pixel pitch even at the boundaries.

Figure 6:
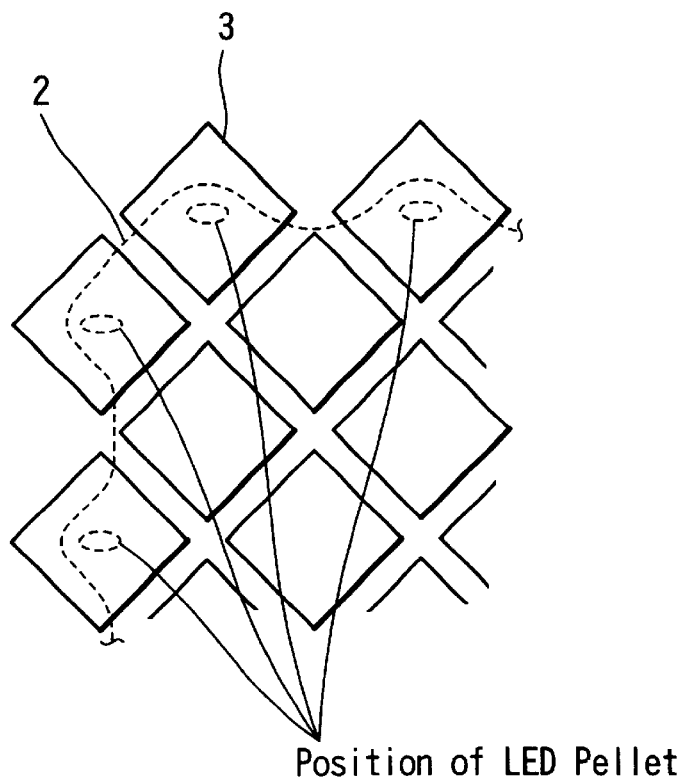
FIG. 6 is a plan view illustrating a modified substrate of the LED plane display unit of FIG. 1.
Figure 7:
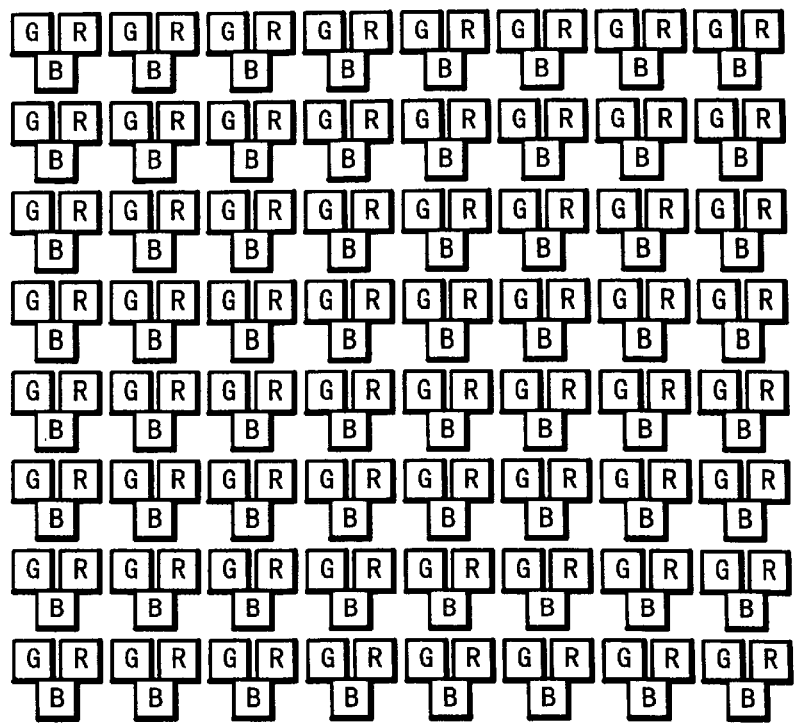
FIG. 7 is a plan view illustrating the shape and arrangement of the light-emitting surfaces of pixels on a conventional LED plane display unit for displaying image.
Figure 8:
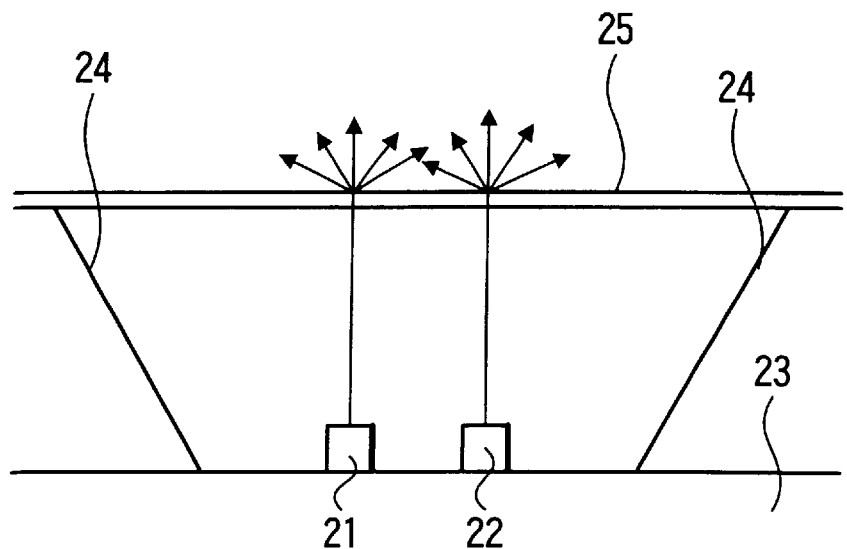
FIG. 8 is a view illustrating the structure of a conventional element on the LED plane display unit for displaying characters.

As a further example as shown in FIG. 6, the size of the surface of the substrate 2 may be selected to be smaller than the size of the contours of the light-emitting surfaces of all pixels 3 on the substrate 2 within a range in which the LED pellets 4, 5 and 6 (FIGS. 3 and 4) of pixels 3 located closest to the edge of the surface of the substrate are allowed to be mounted on the substrate 2, or the wiring can be formed on the substrate 2 to connect the LED pellets 4 to 6 to the drive circuit. In this case, too, the gap among the light-emitting surfaces can be set to be about 1 mm at the boundaries of the neighboring LED plane display units at the time of constituting a large screen by arranging plural LED plane display units like tiles, making it possible to maintain uniform pixel pitch even at the boundaries.

In the plane display unit according to the present invention, further, the numbers of the pixels on the surface of the substrate in the transverse direction and in the longitudinal direction are not limited to those shown in FIG. 1 but may be any suitable numbers.

Further, the length of the side of the light-emitting surface of the pixels on the plane display unit of the invention and the gap between the opposing sides of the light-emitting surfaces of the neighboring pixels, are in no way limited to the examples that are described above, as a matter of course.

In the above embodiment, the number of the pixels on the surface of the substrate in the transverse direction is set to be equal to the number of the pixels in the longitudinal direction. When the plane display units of the invention are to be arranged in a plural number like tiles to constitute a screen having a particular aspect ratio, further, the ratio of the number of the pixels may be determined depending upon the aspect ratio.

In the above embodiment, further, the shape and size of the surface of the substrate of the plane display unit are determined depending upon the contours of light-emitting surfaces of all pixels on the substrate. However, when, for example, only one piece of the plane display unit is used to constitute the screen, the substrate may have a square surface, and the size of the surface of the substrate may be set to be very larger than the size of the contours.

In the above embodiment, further, a light-emitting surface is formed by using LED pellets of red color, green color and blue color. However, a light-emitting surface may be formed by using plural LED pellets of different and suitable colors. Or, a light-emitting surface may be formed by using only one LED pellet. In this case, too, light from the LED pellets is homogeneously scattered on the whole light-emitting surfaces, and the brightness becomes uniform on the light-emitting surfaces.

In the above embodiment, further, the light-emitting surface is of a square shape of which the diagonal lines are oriented in the transverse direction and in the longitudinal direction of the surface of the substrate 2. Not being limited thereto, only, however, the light-emitting surface may have a rhombic shape (a quadrilateral of which all sides have an equal length and the angle subtended by the neighboring sides is not 90°) of which the diagonal lines are oriented in the transverse direction and in the longitudinal direction of the surface of the substrate 2. In this case, too, the ratio of the areas of the gaps among the light-emitting surfaces to the areas of the light-emitting surfaces becomes small. Even when the screen is viewed in a close range, therefore, the image or character does not appear as a set of visible dots. Besides, the apparent pixel pitch becomes shorter than that of the plane display unit on which the pixels having square light-emitting surfaces are arranged in the transverse direction and in the longitudinal direction, enhancing the horizontal resolution and the vertical resolution.

In the above embodiment, the invention was applied to the plane display unit using LEDs as elements. The invention, however, can also be applied to the plane display unit using, for example, a CRT, a discharge tube or a fluorescent display tube as a light-emitting element.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A plane display unit comprising:

pixels of light-emitting elements; and a substrate on which a plurality of said pixels are arranged, wherein said pixels have substantially rhombic-shaped light-emitting surfaces, wherein said surfaces are arranged in a direction inclined toward a right side and in a direction inclined toward a left side with sides of the light-emitting surfaces of said plurality of pixels being opposed to each other.

2. The plane display unit according to claim 1, wherein a shape of a surface of said substrate is substantially the same as a shape of contours of said light-emitting surfaces of said plurality of pixels on said substrate, and a distance from an edge of the light-emitting surface located closest to an edge of the surface of the substrate is zero.

3. The plane display unit according to claim 1, wherein a size of a surface of the substrate is smaller than a size of contours of said light-emitting surfaces of said plurality of pixels on said substrate.

4. The plane display unit according to claim 2, wherein a number of said pixels on the surface of the substrate in a transverse direction is equal to a number of the pixels on the surface of the substrate in a longitudinal direction.

5. The plane display unit according to claim 1, wherein said light-emitting elements are light-emitting diodes, and the light-emitting diodes mounted on said substrate are covered with a transparent material in which a light-scattering material is mixed thereby to form said pixels.

6. The plane display unit according to claim 5, wherein the light-scattering material is one having a refractive index different from the refractive index of said transparent material.

7. The plane display unit according to claim 6, wherein the light-scattering material is one having a refractive index smaller than a refractive index of said transparent material.

8. The plane display unit according to claim 5, wherein said light-emitting diodes are surrounded by a material that reflects light, and a space surrounded by said material that reflects light is filled with said transparent material.

9. The plane display unit according to claim 5, wherein a plurality of light-emitting diodes emit light of different colors and are covered with said transparent material to form said pixels.

10. A plane display device in which a plurality of plane display units are arranged like a matrix to constitute a screen, each plane display unit comprising pixels of light-emitting elements and a substrate on which a plurality of said pixels are arranged, each of said pixels having substantially rhombic-shaped light-emitting surfaces, wherein said surfaces are arranged in a direction inclined toward a right side and in a direction inclined toward a left side with sides of the light-emitting surfaces thereof being opposed to each other.

11. The plane display device according to claim 10, wherein a shape of a surface of said substrate of said display unit is substantially the same as a shape of contours of said light-emitting surfaces of said plurality of pixels on said substrate, and a distance from an edge of a light-emitting surface located closest to an edge of the surface of the substrate is zero.

* * * * *